(12) United States Patent
Kuo (10) Patent No.: US 8,017,517 B2
(45) Date of Patent: Sep. 13, 2011

(54) DUAL DAMASCENE PROCESS

(75) Inventor: Yen Chiu Kuo, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 83 days.

(21) Appl. No.: 11/759,631

(22) Filed: Jun. 7, 2007

(65) Prior Publication Data

US 2008/0305639 A1  Dec. 11, 2008

(51) Int. Cl.
*H01L 21/4763* (2006.01)

(52) U.S. Cl. ........ 438/636; 438/637; 438/638; 438/639; 257/E21.579; 257/E21.252; 257/E21.256

(58) Field of Classification Search .................... 438/636
See application file for complete search history.

(56) References Cited

U.S. PATENT DOCUMENTS

| | | | |
|---|---|---|---|
| 5,702,562 A | 12/1997 | Wakahara | |
| 5,968,847 A | 10/1999 | Ye et al. | |
| 6,127,089 A * | 10/2000 | Subramanian et al. | 430/270.1 |
| 6,197,681 B1 * | 3/2001 | Liu et al. | 438/637 |
| 6,329,118 B1 * | 12/2001 | Hussein et al. | 430/270.1 |
| 6,355,568 B1 | 3/2002 | Wang et al. | |
| 6,448,176 B1 * | 9/2002 | Grill et al. | 438/637 |
| 6,458,516 B1 * | 10/2002 | Ye et al. | 430/317 |
| 6,486,059 B2 | 11/2002 | Lee et al. | |
| 6,495,448 B1 | 12/2002 | Lee | |
| 6,551,924 B1 | 4/2003 | Dalton et al. | |
| 6,723,654 B2 | 4/2004 | Chang et al. | |
| 6,767,825 B1 * | 7/2004 | Wu | 438/633 |
| 6,797,633 B2 * | 9/2004 | Jiang et al. | 438/706 |
| 6,858,377 B2 | 2/2005 | Shu | |
| 6,936,539 B2 | 8/2005 | Yin et al. | |
| 7,129,159 B2 * | 10/2006 | America et al. | 438/618 |
| 2001/0023990 A1 * | 9/2001 | Yokoyama et al. | 257/773 |
| 2002/0173152 A1 * | 11/2002 | Chen et al. | 438/691 |
| 2003/0020176 A1 * | 1/2003 | Nambu | 257/774 |
| 2003/0032274 A1 * | 2/2003 | Daniels et al. | 438/597 |
| 2003/0171001 A1 | 9/2003 | Shinohara | |
| 2003/0207207 A1 * | 11/2003 | Li | 430/272.1 |
| 2004/0248409 A1 * | 12/2004 | Padhi et al. | 438/653 |
| 2005/0142886 A1 * | 6/2005 | Lee et al. | 438/710 |
| 2005/0205519 A1 * | 9/2005 | Kim et al. | 216/67 |
| 2005/0214694 A1 * | 9/2005 | Hong et al. | 430/323 |

(Continued)

OTHER PUBLICATIONS

Hand, Aaron, "Applied's Litho Scheme: Patterning vs. Printing", at http://www.reed-electronics.com/semiconductor/index.asp?layout=articlePrint&articleID=CA6428429, May 23, 2007.
Applied Materials, Inc.-Applied Producer APF (Advanced Patterning Film) PECVD, at http://www.appliedmaterials.com/products/producer_apf_4.html?menuID-11_7_2, May 23, 2007.

*Primary Examiner* — Charles D Garber
*Assistant Examiner* — Pape Sene
(74) *Attorney, Agent, or Firm* — Frank J. Spanitz; Duane Morris LLP (57) ABSTRACT

A method and system for forming dual damascene structures in a semiconductor package. In one embodiment, the method includes forming an intermediate dielectric layer on a bottom stop layer; forming an ashing removable dielectric layer on the intermediate dielectric layer; forming a patterned photoresist layer above the ashing removable dielectric layer in the semiconductor structure; and defining an in-situ hard mask in the ashing removable dielectric layer having an opening with a profile selected from the group consisting of a via, a trench, or a combination thereof. The profile of the in-situ mask preferably is capable of being transferred to the intermediate dielectric layer by etching.

14 Claims, 11 Drawing Sheets

U.S. PATENT DOCUMENTS

2006/0063376 A1* 3/2006 Lee et al. .............. 438/638
2006/0246717 A1* 11/2006 Wang .............. 438/637
2006/0266478 A1* 11/2006 Lee et al. .............. 156/345.24
2008/0020319 A1* 1/2008 Yeh et al. .............. 430/270.1

* cited by examiner

DUAL DAMASCENE PROCESS

FIELD OF THE INVENTION

The present invention generally relates to semiconductors, and more particularly to systems and methods for fabricating semiconductor microchips.

BACKGROUND

Modern semiconductor packages are formed from multiple layers that may include numerous active components electrically coupled together by metal conductor interconnects. Although aluminum conductors with silicon dioxide disposed between such interconnects have been used in the past, current practices in fabricating high speed semiconductor devices and have moved toward using a combination of copper interconnects with suitable dielectric materials or films such as low-k dielectrics to take advantage of the superior conductivity of copper compared to aluminum and reduced parasitic capacitance between the conductors.

Back end-of-line ("BEOL") processes are used to create the intricate network of conductor interconnects in each layer and between the multiple layers wherein copper is laid into the dielectric material. An additive patterning process referred to as "dual damascene" is one BEOL process used to form the patterned copper conductor circuit(s) which interconnect various active components (e.g., resistors, transistors, etc.) disposed in the single and multiple layers throughout the microchip. Some of these interconnect circuit structures include trenches which are filled with the copper conductor and vias which are essentially metal-plated or filled holes that electrically connect the conductors between the layers in the semiconductor packages.

These open trench and via structures are formed in the dielectric material using various processes such as dry gas plasma etching. Dry etching is performed in an etcher machine by applying an electromagnetic energy source (such as RF) to a gas containing a suitable chemically reactive element that reacts with the material to be etched or removed. The gas plasma emits positively charged ions that strike and dissolve the dielectric material. By placing hard masks above the dielectric material layer with openings configured in the shape of the circuit desired to be formed, various patterns of trench and via openings can be made in the dielectric material since dielectric material beneath the hard mask will not dissolve. Because the ions strike the dielectric material essentially perpendicular to its surface, vertical trench and via profiles can be created with virtually no undercutting beneath the hard mask.

After the trenches and vias are formed by dry etching, copper may be deposited in these open structures in the dielectric by any suitable known technique such as chemical vapor deposition (CVD), physical vapor deposition (PVD), electro-chemical plating (ECP), electroless-plating, etc. Subsequent processes such as chemical mechanical planarization (CMP) or etching may be used in some instances as needed to polish and plane the top surface of the dielectric material layer, thereby leaving an essentially flat surface on which subsequent layers of dielectric with interconnects can be built.

Figure 1:
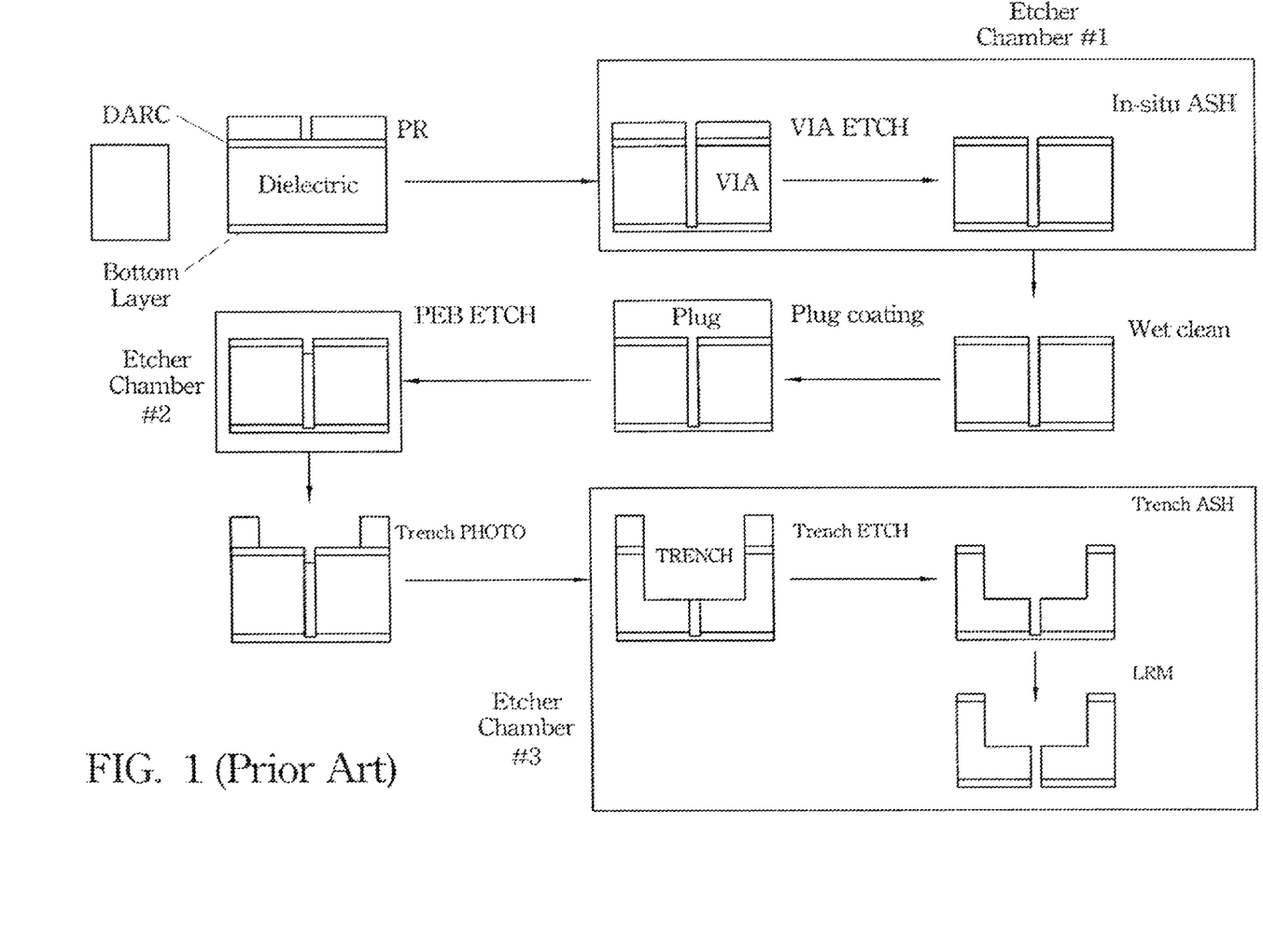
FIG. 1 shows a conventional semiconductor package structure and sequential cross-sectional side views through the semiconductor during a conventional BEOL process.

Referring to FIG. 1, a conventional known BEOL dual damascene process is shown in sequential steps as indicated by the process directional arrows. The semiconductor package consists of a bottom etch stop layer, a dielectric layer formed thereon, a dielectric anti-reflective coating (DARC) formed thereon to protect the dielectric layer during photolithography and photoresist ashing, and a patterned photoresist layer (PR) formed thereon having a via profile. As shown in FIG. 1, this conventional dual-damascene BEOL process requires at least two hard masks for separately forming vias and trenches in the semiconductor layer. Because a separate via mask and trench mask are typically needed, the separate trench and via formation in the semiconductor layer under these circumstances must be completed in two dry etcher chambers (see Etcher Chambers #1 and 3). The via is fully formed in the semiconductor layer in Etcher Chamber #1, typically by dry plasma gas etching. After formation of the via, the exposed bottom etch stop layer at the lower end of the via is protected with a photoresist plug coating to prevent the bottom layer from being opened when the trenches are subsequently etched into the dielectric material in Etcher Chamber #3. This requires another operation called plug etch back (PEB) after the trench is formed in yet a third Etcher Chamber #2 to remove the plug material from top surface of the DARC so that a second patterned photoresist layer having a trench profile can be added thereon. The second patterned photoresist layer is then used to fully form the trench in the semiconductor layer. Accordingly, the via and trenches are formed in separate etcher chambers.

Consequently, in order to complete the foregoing steps in a conventional semiconductor BEOL process, at least three dry etcher chambers have been used to complete the separate etching steps of forming vias, forming trenches, and PEB. This monopolizes available etcher chamber capacity and results in a complex fabrication process that is time consuming and expensive. According, semiconductor package fabrication costs are increased while the number of wafers per hour that can be processed is reduced.

An improved semiconductor dual damascene method is desired.

SUMMARY

A dual damascene process is provided in which a temporary in-situ hard mask is created in one of the semiconductor layers to pattern the vias and/or trenches in the dielectric layer. In one embodiment, the in-situ mask is formed in a disposable ashing removable material such as an ashing removable dielectric layer having the properties of a photoresist material. The further selection of specific materials for the various semiconductor layers, etch gas chemistries, and process steps provide the ability to selectively remove materials and etch the open dual damascene structures therein for the semiconductor package. Advantageously, the foregoing allows the vias and trenches to be created in a single etcher chamber of a commercially-available dry etching tool in a preferred embodiment.

In one embodiment, a method for forming a multi-layered semiconductor structure includes: forming an intermediate dielectric layer on a bottom stop layer; forming an ashing removable dielectric layer on the intermediate dielectric layer; forming a patterned photoresist layer above the ashing removable dielectric layer in the semiconductor structure; and defining an in-situ hard mask in the ashing removable dielectric layer having an opening with a profile selected from the group consisting of a via, a trench, and combinations thereof. Preferably, the profile of the in-situ mask is capable of being transferred to the intermediate dielectric layer by etching.

In another embodiment, a method for forming a multi-layered semiconductor structure includes: forming an intermediate dielectric layer on a bottom stop layer; forming an ashing removable dielectric layer on the intermediate dielectric layer; forming a dielectric anti-reflective coating on the intermediate dielectric layer; forming a first patterned photoresist layer on the dielectric anti-reflective coating; defining an in-situ hard mask in ashing removable dielectric layer having an opening with a profile selected from the group consisting of a via, a trench, or a combination thereof; and etching the intermediate dielectric layer using the in-situ mask to form a via and trench in the intermediate dielectric layer in one etcher chamber.

In another embodiment, a method for forming a dual damascene recess in a multi-layered semiconductor structure includes: forming a semiconductor structure including a bottom stop layer, an intermediate dielectric layer formed thereon, an ashing removable dielectric layer formed thereon including an in-situ mask defining an opening having a profile selected from the group consisting of a via, a trench, and a combination thereof, a dielectric anti-reflective coating formed thereon, and a patterned photoresist layer formed thereon having a pattern defining an opening with a profile selected from the group consisting of a via, a trench, or a combination thereof, partially transferring the profile of the photoresist layer or the in-situ mask to the intermediate dielectric layer to form a recess therein, wherein the recess does not contact the bottom stop layer; and removing the photoresist layer after partially transferring the profile to the intermediate dielectric layer. In one embodiment, the method further includes a step of completely removing the dielectric anti-reflective coating after the photoresist removal.

BRIEF DESCRIPTION OF THE DRAWINGS

The features of the preferred embodiments will be described with reference to the following drawings where like elements are labeled similarly, and in which.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

One embodiment of an exemplary dual damascene process is illustrated in FIGS. 2-11, which shows sequential cross-sectional side views through a semiconductor during the semiconductor fabrication process. In this embodiment, an in-situ hard mask is formed during a series of initial steps shown in FIGS. 2-5 from one of the semiconductor layers. As further described herein, the in-situ mask in combination with a novel combination of materials, etching gas chemistries, and sequence of fabrication steps to selectively remove portions of material advantageously reduces the number of and simplifies processing steps required to etch the semiconductor in contrast to conventional methods. Advantageously, a semiconductor 10 formed in the foregoing manner to be further described herein allows the vias and trench formation to be completed in a single etcher chamber of a conventional etching tool. A reduction may beneficially be realized in production costs while increasing wafer per hour throughput in the dual damascene process.

The embodiment in FIGS. 2-11 illustrates one possible dual damascene process in which the in-situ mask is first patterned for the vias. In other embodiments described herein, the in-situ mask is first patterned for the trenches.

It should be noted that the dual damascene processes described herein preferably use dry gas plasma etching and ashing, which are preferred material removal methods for making copper/low-k dielectric semiconductors. Etching and ashing processes are generally directed to the selective removal of different types of materials. Because the chemical composition of materials varies, it is known in the art that different types of materials require different types of gases with certain reactive agents for material removal. Accordingly, certain materials will be partially or completely resistant to material removal if the proper etching or ashing gas chemistry is not used. As further described herein, by selecting various combinations of materials and using different etching or ashing gases along with a defined sequence of fabrication steps, various dual damascene structures can be fabricated.

Etching gas plasmas are typically used for material removal from dielectric layers (e.g., to form vias and trenches). Etching processes using etching gas plasmas are generally performed at lower temperatures and pressures than ashing. Ashing gas plasmas are typically used for selectively removing materials such as photoresists and those materials with similar chemistries. Ashing gas plasmas are generally less aggressive than etching gas plasmas. Ashing with ashing gas plasmas are generally performed at higher temperatures and pressures than etching processes. The terms "etching" and "ashing" are used herein consistent with respect to the foregoing description of each process.

The semiconductor etching and ashing processes described herein can be performed in an etcher chamber of a commercially-available etching tool, such as those supplied by Applied Materials, Incorporated.® In contrast to wet etching procedures, anisotropic dry plasma etching and ashing enables vertical etching to be performed that produces substantially uniform and straight vertical walls for via and trenches profiles.

Figure 2:
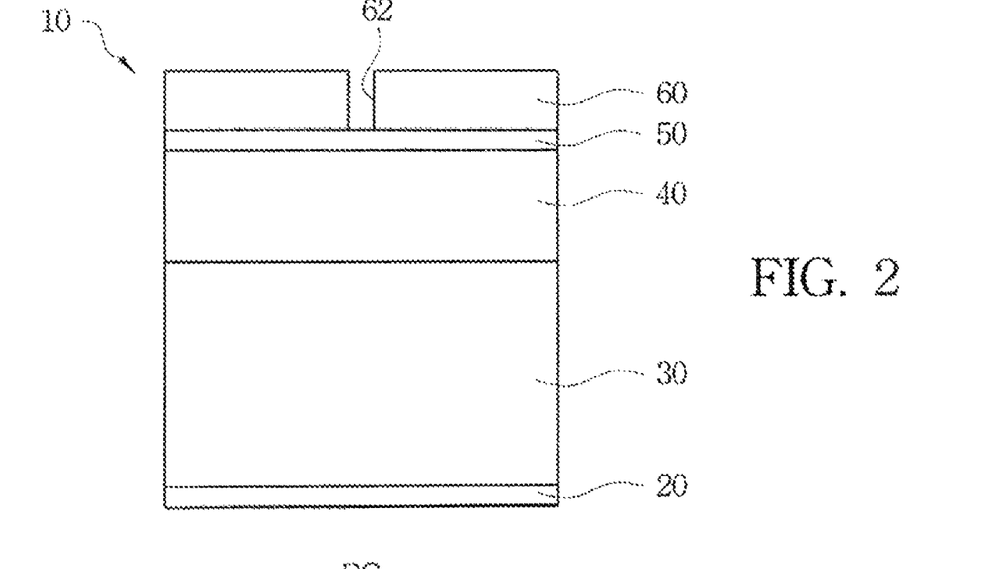
FIGS. 2-11 show an exemplary semiconductor package structure and sequential cross-sectional side views through the semiconductor during an exemplary BEOL accordingly to one preferred embodiment.
Figure 3:
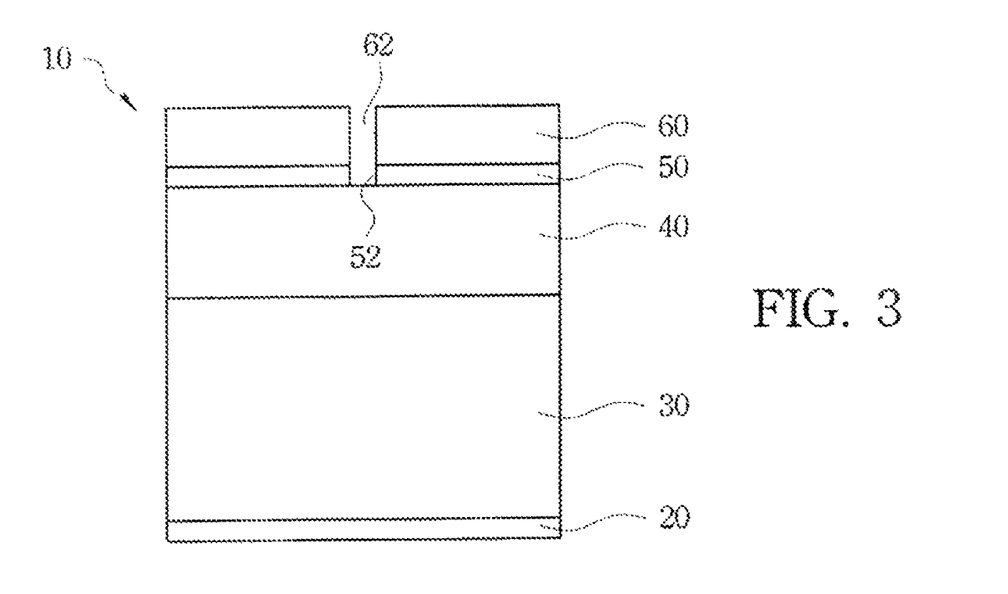

Beginning now with reference to FIG. 2, a multi-layer semiconductor 10 is created by sequentially forming from the bottom upwards a bottom stop layer 20, an intermediate dielectric layer (IDL) 30 thereon, an ashing removable layer such as ashing removable dielectric (ARD) layer 40 thereon, and a top dielectric anti-reflective coating (DARC) 50 thereon.

In contrast to the prior art wafer shown in FIG. 1, it will be noted that ashing removable dielectric layer 40 has been inserted between dielectric anti-reflective coating 50 and intermediate dielectric layer 30 in the new wafer construction. Ashing removable dielectric 40 in a preferred embodiment is a photoresist-like material having generally the properties of a photoresist and amendable to etching and patterning like a photoresist. Therefore, in a preferred embodiment as further described herein, the materials selected for both photoresist layer 60 and ashing removable dielectric 40 material are preferably susceptible to material removal by dry plasma ashing, and more preferably by an oxygen plasma ashing gas. Also preferably, ashing removable dielectric 40 does not adversely affect the properties of intermediate dielectric layer 30. In one possible typical embodiment, ashing removable dielectric 40 may be a strippable CVD-deposited hardmask film such as Applied Materials Incorporated's® Advanced Patterning Film which is an amorphous carbon material that produces higher definition patterns. In a preferred embodiment, ashing removable dielectric layer 40 is intended to be disposable and used temporarily during the fabrication process as an in-situ hard mask for patterning intermediate dielectric layer 30. After the trenches and vias have been fully formed in intermediate dielectric layer 30, ashing removable dielectric layer 40 is therefore completely removed from the final semiconductor package.

With continuing reference to FIG. 2, prior to placing semiconductor 10 into a first dry etcher chamber, a photoresist layer 60 is deposited on top of dielectric anti-reflective coating layer 50. Using photolithography in one embodiment, a resist pattern is formed in photoresist layer 60 defining first opening 62, which in one embodiment is sized and configured to be a via-shaped profile. Via-shaped opening 62 will be used to produce an in-situ mask in ashing removable dielectric 40 as further described below, which in turn will be used for ultimately patterning intermediate dielectric layer 30 with a via of predetermined size and configuration.

Intermediate dielectric layer 30 may be any suitable material. Preferably, intermediate dielectric layer 30 is a low-k dielectric material suitable for fabricating high speed copper conductor/low-k dielectric semiconductor devices, and more preferably is an oxide film (OX) such as without limitation Black Diamond® available from Applied Materials, Incorporated.® Other suitable conventional dielectric materials may be used in the preferred process described herein, including without limitation fluorinated silicate glass (FSG) or undoped silicate glass (USG). In a preferred embodiment, the material selected for intermediate dielectric layer 30 is resistant to etching by the dry gas plasma ashing process used to etch ashing removable dielectric 40 so that intermediate dielectric layer 30 serves as a stop when forming a hard mask in ashing removable dielectric 40, as described below. An appropriate thickness of intermediate dielectric layer 30 may be selected based on the semiconductor package design requirements.

After photoresist layer 60 has been patterned, semiconductor 10 is placed in a first dry etcher chamber as shown in FIG. 2. In the next step shown in FIG. 3, an opening 52 is formed in dielectric anti-reflective coating 50 by dry etching with a suitable etching gas "EG" (denoted in the figures) using photoresist layer 60 as a mask. This exposes ashing removable dielectric 40 below via-shaped opening 52. In some embodiments, the etching gas EG may be without limitation a fluorinated gas containing for example elemental fluorine F, $CF_4$, $C_4F_8$, $CHF_3$, $CH_2F_2$, or $C_5F_8$. Other suitable etching gases, however, may also be used. The type of etching gas EG used will depend on the material selected for dielectric anti-reflective coating 50 and intermediate dielectric layer 30, both of preferably are susceptible to etching using the same etching gas EG.

In one embodiment, dielectric anti-reflective coating 50 may be an oxidized film (OX), silicon nitride (SiN), silicon oxynitride (SiON), nitride-free anti-reflective coating, or other suitable materials so long as the dielectric anti-reflective coating 50 preferably cannot be etched by the same ashing gas AG plasma chemistry used to remove material from ashing removable dielectric 40 or photoresist layer 60, for reasons explained below. Preferably, the material selected for dielectric anti-reflective coating 50 is amenable to etching with one of the foregoing etching gases EG in a preferred embodiment. Dielectric anti-reflective coating 50 may be deposited on ashing removable dielectric 40 by any suitable known method, such as for example CVD, MVC, EPC, etc. Advantageously, dielectric anti-reflective coating 50 reduces light reflection when photoresist layer 60 is patterned by photolithography to protect underlying ashing removable dielectric layer 40 and serves during various process steps to protect portions of ashing removable dielectric 40 from material removal by either the ashing gas AG or etching gas EG, as further explained herein. An appropriate thickness of dielectric anti-reflective coating 50 may be selected based on producing optimum conditions for etching ashing removable dielectric 40 and intermediate dielectric layer 30.

Figure 4:
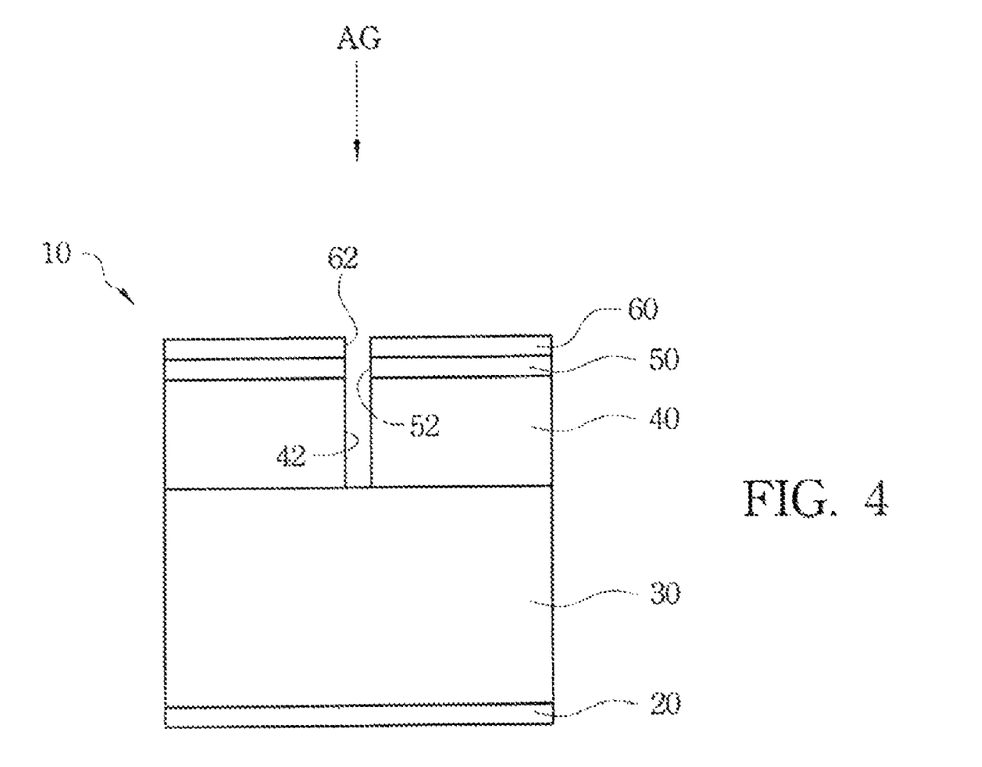
Figure 5:
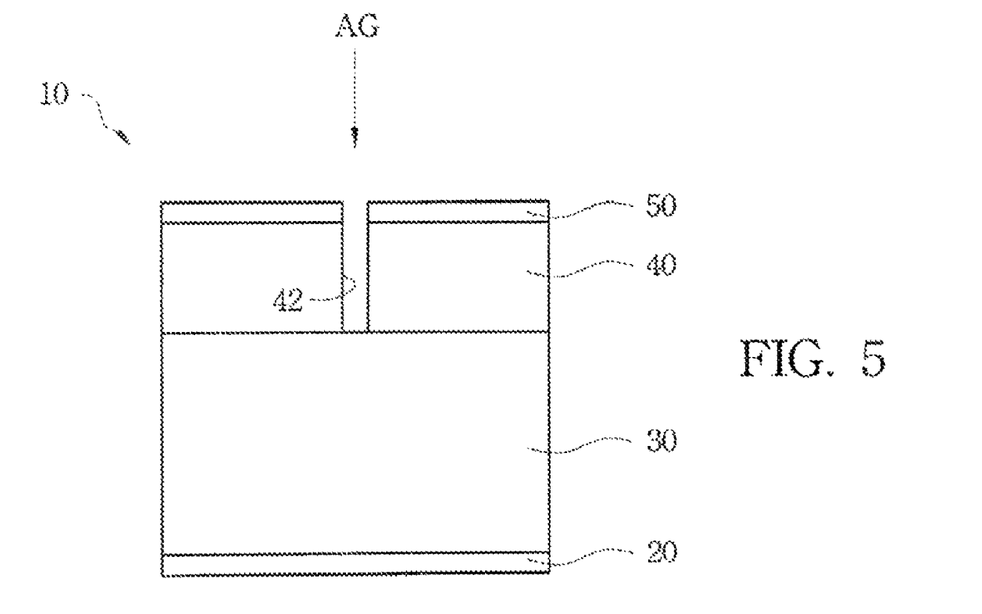
Figure 6:
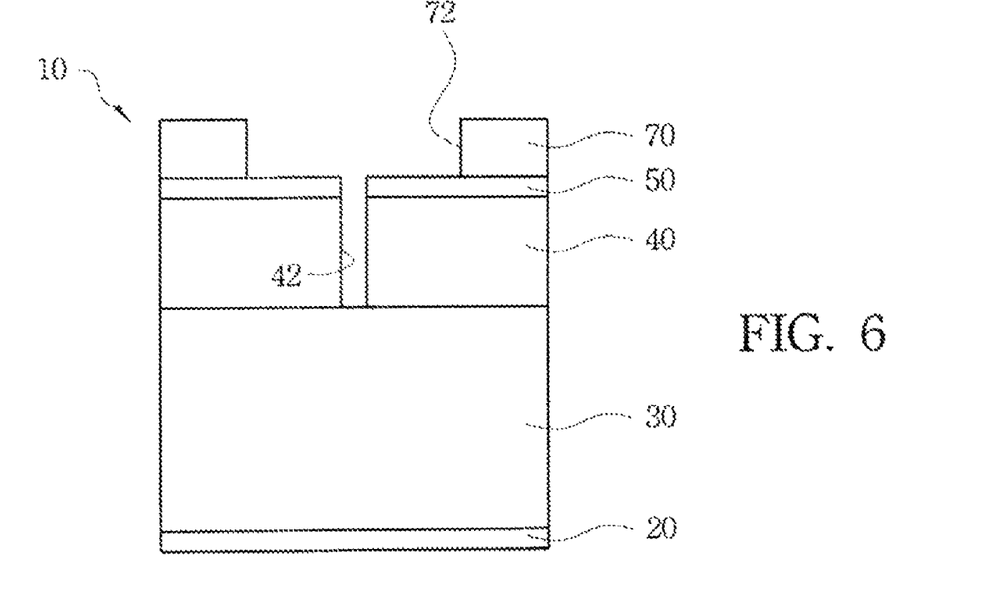

In the next step shown in FIG. 4, a predetermined via hard mask profile is patterned into ashing removable dielectric 40 in the form of via-shaped opening 42. In a preferred embodiment, the via hard mask is made by selectively removing material from ashing removable dielectric 40 with a plasma ashing gas "AG" (denoted in the figures) to form via-shaped opening 62. Preferably, ashing gas AG may comprise a gas plasma containing a monatomic reactive species such as $O_2$, $N_2$, $H_2$, or another suitable species. In a preferred embodiment, an oxygen $O_2$ plasma ashing gas AG is used. Ashing removable dielectric 40 with opening 42 thus defines an in-situ via-shaped hard mask which will later be used in the main via-trench formation process to create the predetermined via profile in intermediate dielectric layer 30, as shown in FIGS. 7-11. In some embodiments, however, photoresist 60 thickness may be such that after trench-shaped opening 42 is formed in ashing removable dielectric 40 (see FIG. 4), some photoresist may remain (as also shown in FIG. 4) such that additional ashing shown in the step illustrated in FIG. 5 is required to completely remove the photoresist. In other embodiments, photoresist 60 thickness may be such that no photoresist remains after forming opening 42 in ashing removable dielectric 40 thereby requiring no further ashing.

In the next step shown in FIG. 5, photoresist layer 60 is completely removed from semiconductor 10, leaving etched dielectric anti-reflective coating 50 and ashing removable dielectric layer 40 with via-shaped opening 42 remaining. In a preferred embodiment, photoresist layer 60 is made of a material that is removable using the same ashing gas AG used to profile ashing removable dielectric 40. Preferably, therefore, the same ashing gas AG may be used in this step to remove photoresist layer 60. It should be noted that dielectric anti-reflective coating 50, which preferably is made of a material that is unaffected by the ashing gas AG, functions to protect unexposed portions of ashing removable dielectric 40 beneath the dielectric anti-reflective coating when photoresist layer is removed from semiconductor 10 in FIG. 5.

It should be noted that at the completion of the process step shown in FIG. 5, intermediate dielectric layer 30 also has not been etched at all since this layer is preferably resistant to etching by the ashing gas AG used to remove photoresist layer 60. By contrast with the conventional process shown in FIG. 1, the via is fully formed in the semiconductor layer at the completion of processing in etching chamber 1. Therefore, plug coating and plug etch-back of the via are needed to prevent penetration of the bottom layer during subsequent trench etching of the semiconductor layer to prevent damage to copper conductors beneath the bottom layer. Advantageously, in the preferred embodiment disclosed herein, both the plug coating and etch-back steps are eliminated as well as the need for processing in yet an additional etcher chamber for plug etch-back as shown in FIG. 1.

After photoresist layer 60 has been removed, semiconductor 10 is removed from the first etcher chamber for additional photolithographic processing in a photolithography tool. Referring to semiconductor 10 shown in FIG. 6, a new photoresist layer 70 is coated onto dielectric anti-reflective coating 50. Using photolithography in one embodiment, a resist pattern is next formed in photoresist layer 70 to define opening 72, which this time is sized and configured to have a trench-shaped profile. Trench-shaped opening 72 will be used to further define ashing removable dielectric layer 40 to produce an in-situ mask combining both the desired trench and via profile, which will then be transferred to intermediate dielectric layer 30 as further described below.

After photoresist layer 70 has been patterned, semiconductor 10 is returned to the same dry etcher chamber in the steps of FIGS. 2-5, or alternatively may be placed in a different dry etcher chamber. FIGS. 7-10 show the main process steps of forming a via and trench in intermediate dielectric layer 30, using the via-shaped in-situ mask formed in ashing removable dielectric 40 in the ancillary process steps shown in FIGS. 2-5 described above. In a preferred embodiment, the via and trench are advantageously formed essentially simultaneously in intermediate dielectric layer 30 in the same dry etcher chamber as described herein by using the via-shaped e in-situ hard mask.

Figure 7:
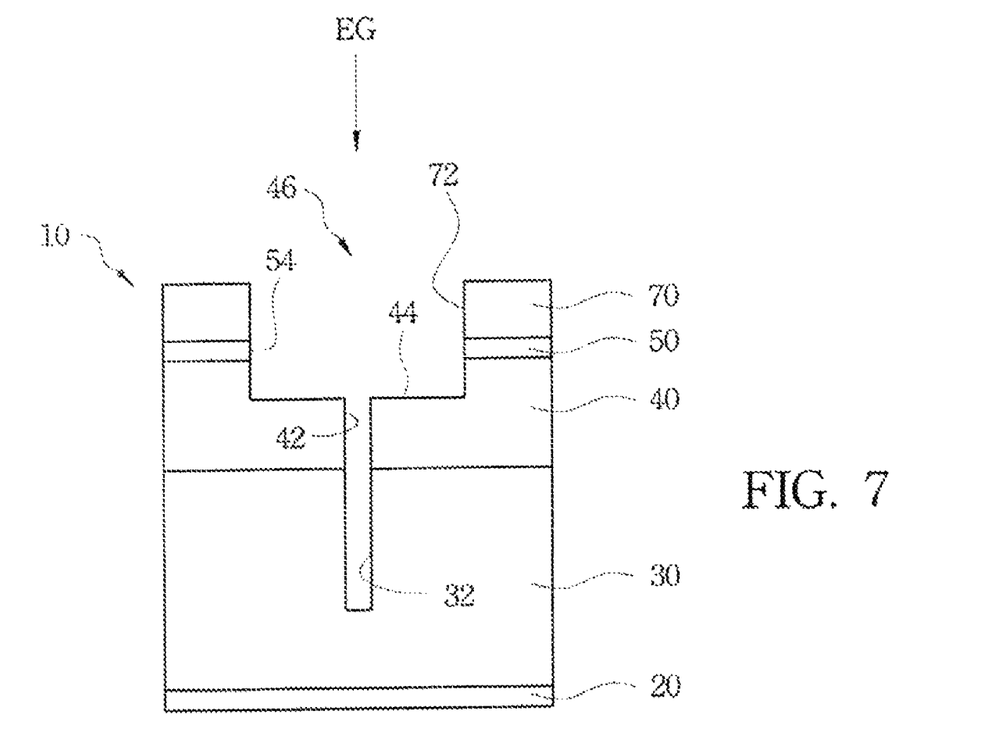

Referring now to FIG. 7, exposed portions of dielectric anti-reflective coating 50 that are not protected by photoresist layer 70 are removed by dry etching with etching gas EG to form trench-shaped opening 54 in the dielectric anti-reflective coating. This exposes ashing removable dielectric 40 below trench-shaped opening 54. In a preferred embodiment, both intermediate dielectric layer 30, photoresist layer 70, and ashing removable dielectric 40 are susceptible to etching and material removal using the same etching gas EG. However, both photoresist layer 70 and ashing removable dielectric 40 preferably are not as susceptible to and more resistant to etching using this same etching gas EG than so that layer 70 may be used to protect unexposed portions of dielectric anti-reflective coating 50 to form trench shaped opening 54. In a preferred embodiment, therefore, etching gas EG removes material photoresist layer 70 and ashing removable dielectric 40 at a slower rate than from intermediate dielectric layer 30 (compare, for example, FIGS. 6 and 7 wherein the thickness of photoresist layer 70 is reduced such that in FIG. 7 the thickness is less than shown in FIG. 6). The fluorine present in etching gas EG consumes a little of the photoresist and ashing removable dielectric material.

With continuing reference to FIG. 7, semiconductor 10 is further dry etched using etching gas EG to at least partially form a trench-shaped opening 44 having a trench profile in ashing removable dielectric 40, and further to at least partially extend and transfer the via profile into intermediate dielectric layer 30 to partially form via 32 therein as shown. Preferably, via 32 is etched to a depth that is less than the thickness of intermediate dielectric layer 30 so that via 32 does not contact bottom stop layer 20. It will be noted that this step produces a completed in-situ mask in ashing removable dielectric 40 having an opening 46, which in one embodiment has the combined profile of both the via and trench defined by openings 42 and 44. In a preferred embodiment, partially formed via 32 is made essentially simultaneously with the partial formation of trench-shaped opening 44 in ashing removable dielectric 40.

Figure 8:
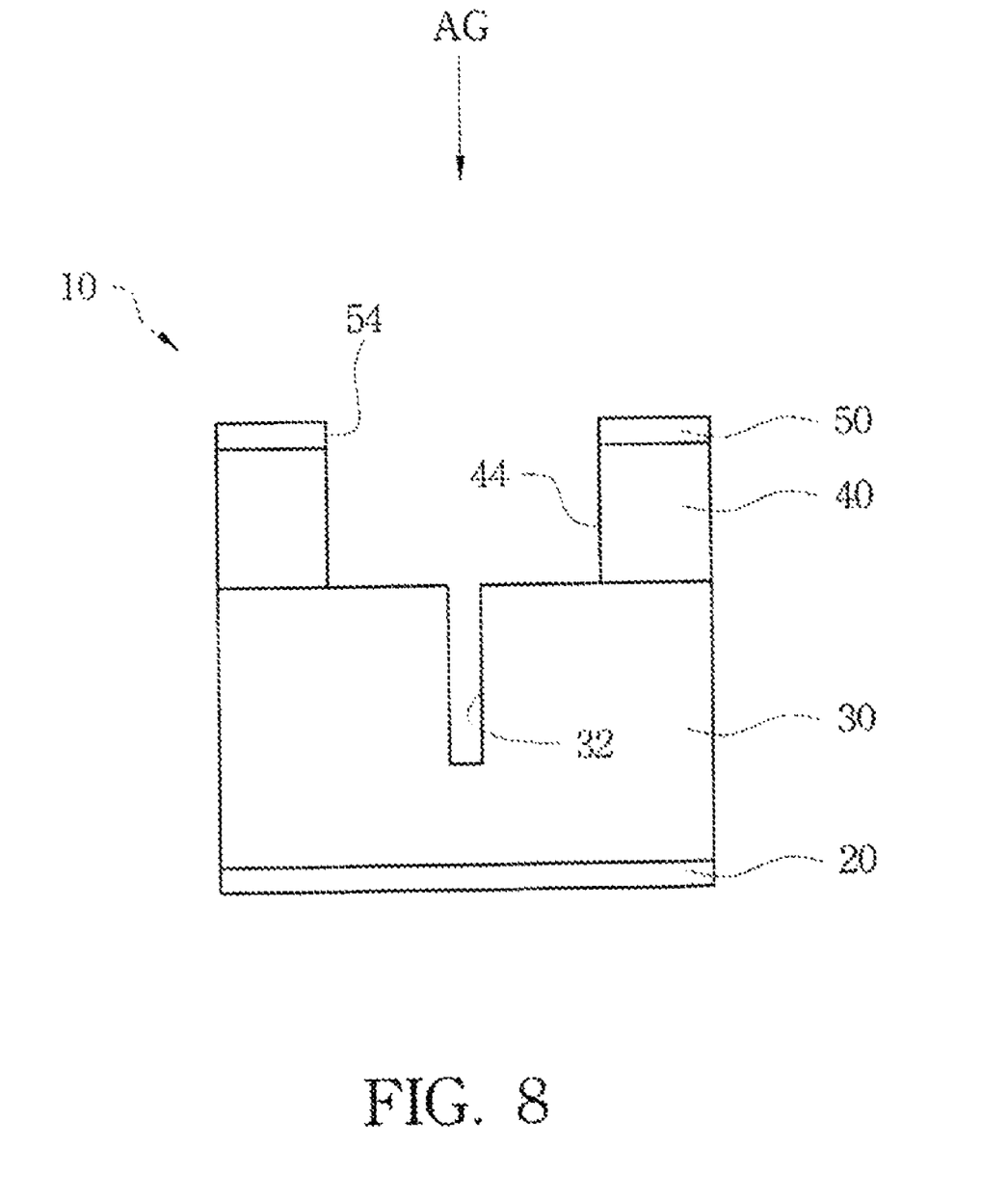

In the next step shown in FIG. 8, two process objectives are advantageously completed by virtue of the materials and etching processes selected for use. First, ashing removable dielectric 40 is selectively dry ashed with ashing gas AG to fully form and extend trench-shaped opening 44 down to intermediate dielectric layer 30; the latter which acts as an etching stop since the intermediate dielectric layer preferably is not susceptible to etching by the ashing gas AG. In one embodiment, therefore, the same ashing gas AG is used in this step that was also used to define via-shaped opening 42 in the step shown in FIG. 3. The second process objective that may be completed during the step shown in FIG. 6, in one embodiment, is that photoresist layer 70 is completely removed from semiconductor 10 by the same ashing gas AG.

Figure 9:
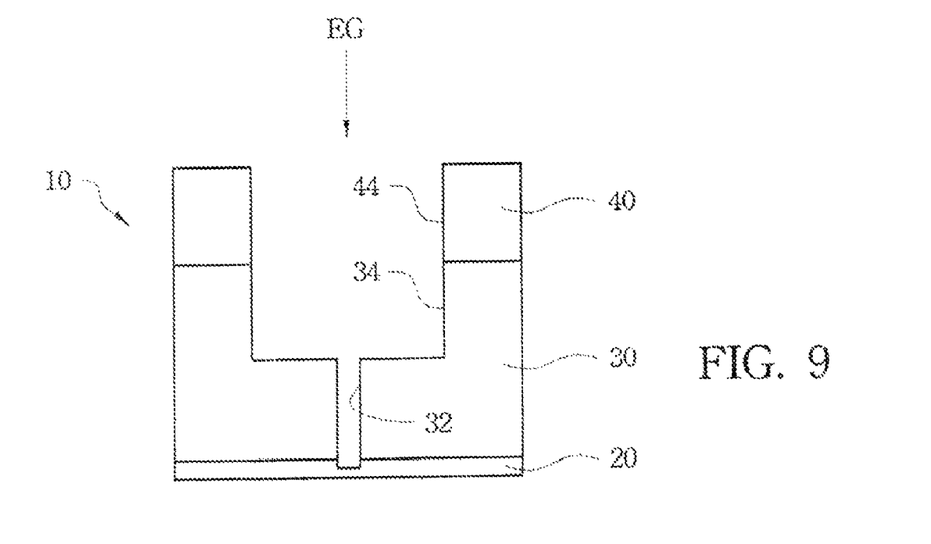

FIG. 9 shows the next step of fully forming via 32 and trench 34 in intermediate dielectric layer 30. Using the in-situ hard mask made from ashing removable dielectric 40, the trench and via profiles are transferred to intermediate dielectric layer 30 by dry etching using etching gas EG. Via 32 and trench 34 define an open dual damascene recess or structure that is sized and configured to receive a metallic interconnect conductor material, such as copper in one embodiment. Advantageously, trench 34 and via 32 may be formed during the same sequence of steps in a single dry etcher chamber using the in-situ hard mask in ashing removable dielectric layer 40. Via 32 preferably contacts, but does not fully penetrate bottom stop layer 20. Bottom stop layer 20 serves as an etch stop to protect copper conductors 80 disposed in a substrate beneath the via (see FIG. 10) during via 32 formation. Bottom stop layer 20 also protects copper conductors 80 from being damaged by oxidation by the ashing gas AG during the subsequent process step of completely removing ashing removable dielectric layer 40 in FIG. 10. In contrast to conventional known processes shown in FIG. 1, therefore, via 32 need not be plugged and then plug-etch back performed to remove the plug as in order to protect underlying copper conductors 80. It should be noted that bottom stop layer 20 also prevents copper ions from migrating into and possibly contaminating intermediate dielectric layer 30 above.

Since dielectric anti-reflective coating 50 is no longer protected by photoresist layer 70, which was completely removed in the step shown in FIG. 8, the dielectric anti-reflective coating may also be completely removed by etching gas EG during this step as shown in FIG. 9. Advantageously, trench 34 and via 32 have been formed in the same dry etcher chamber using the in-situ hard mask formed in ashing removable dielectric layer 40. It will further be noted that in some embodiments, if trench 34 and via 32 are not fully formed when dielectric anti-reflective coating 50 has been completely removed by etching gas EG, the thickness of ashing removable dielectric layer 40 may be reduced as shown in FIG. 9 since the ashing removable dielectric is not completely resistant to etching gas EG due to the fluorine in the gas as noted herein. Preferably, the thickness of the ashing removable dielectric layer 40 is sufficient so that it will not be completely removed at least until trench 34 and via 32 have been completely formed.

Figure 10:
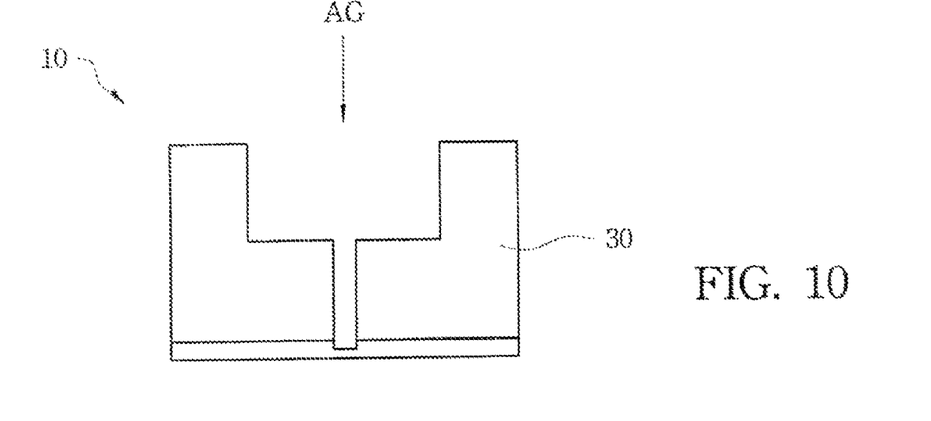

In the next step shown in FIG. 10, remaining portions of ashing removable dielectric 40 are completely removed with the ashing gas AG. Since intermediate dielectric layer 30 and bottom stop layer 20 are preferably not susceptible to etching by the ashing gas AG in the preferred embodiment, these layers are unaffected.

Figure 11:
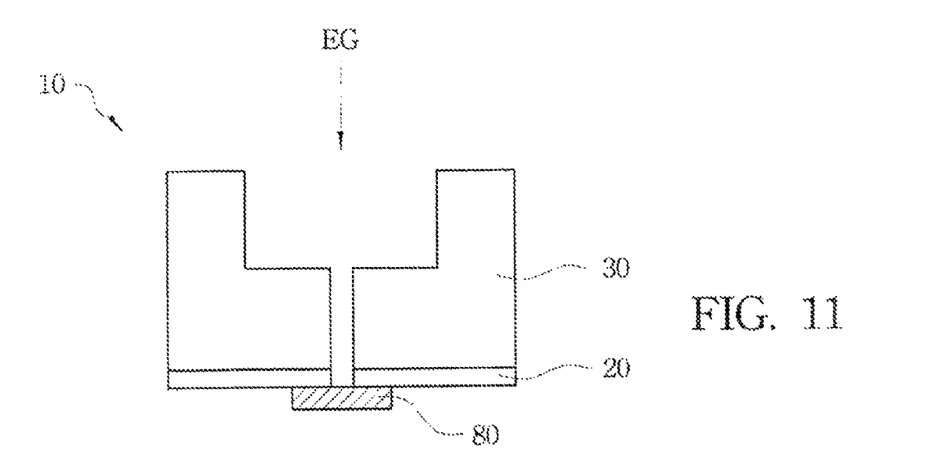

In the final step shown in FIG. 11, the portion of the bottom stop layer 20 beneath via 32 is opened by dry etching using the etching gas EG to allow via 32 to communicate with a copper conductor 80 which may be located in another semiconductor layer disposed beneath bottom stop layer 20. Bottom stop layer 20 in some embodiments may be silicon nitride, silicon oxynitride, or silicone oxide. However, any suitable stop material may be used so long as it is not preferably susceptible to etching by ashing gas AG. An appropriate thickness for bottom stop layer 20 may be selected based on ensuring that metal conductors deposited in the semiconductor package below the bottom stop layer are not exposed before the stop layer 20 is intended to be opened after the trench and via formation steps are completed (see, e.g. FIGS. 11 and 21).

In subsequent process steps, copper may next then be deposited to fill via 32 and trench 34 by any suitable material deposition process known in the art, as noted above. Additional intermediate dielectric layers with predetermined vias and trenches may be formed on top of intermediate dielectric layer 30 in the same manner described above and shown in FIGS. 2-11.

Another embodiment of an exemplary dual damascene process is illustrated in FIGS. 12-21, in which the in-situ mask in ashing removable dielectric layer 40 is first patterned for the trenches. FIGS. 12-21 show sequential cross-sectional side views through a semiconductor during the trench and via formation process. In this embodiment, an in-situ trench mask is first formed during a series of initial ancillary process steps shown in FIGS. 12-15 from ashing removable dielectric layer 40. The same etching gas EG and ashing gas AG used in the process described in FIGS. 2-11 may be used in this alternative process embodiment.

Figure 12:
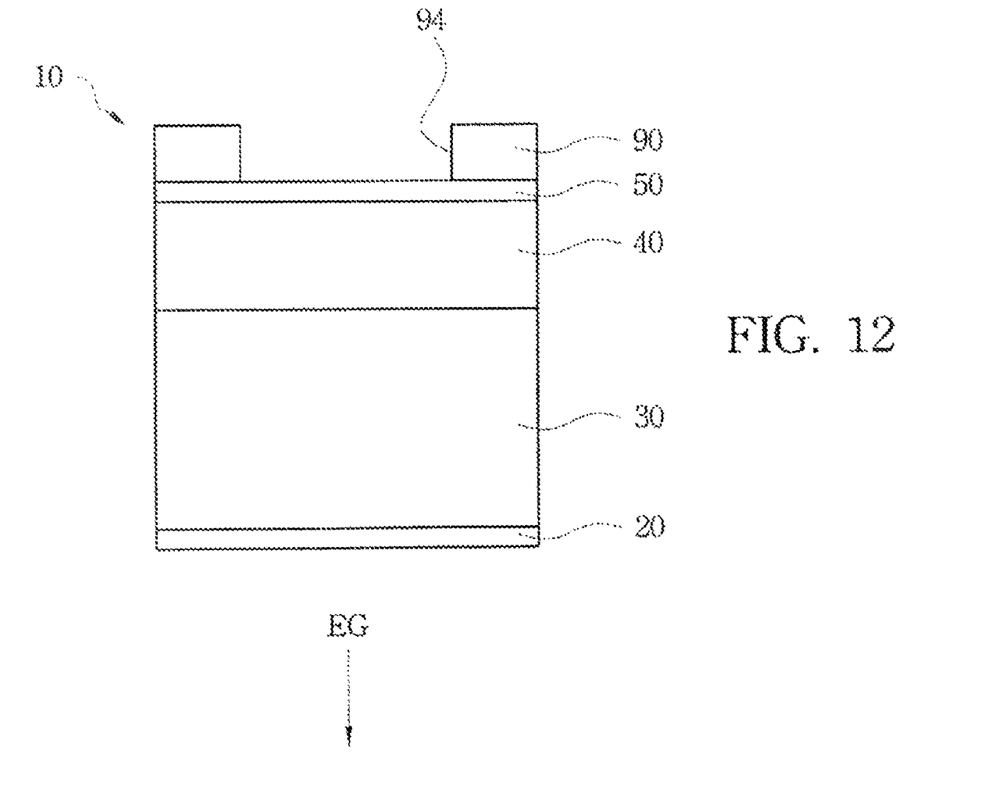
FIGS. 12-21 show an exemplary semiconductor package structure and sequential cross-sectional side views through the semiconductor during an exemplary BEOL accordingly to a second preferred embodiment.

Referring to FIG. 12, a semiconductor 10 is provided similarly to that shown in FIG. 1, which generally includes (from the bottom upwards) bottom stop layer 20, intermediate dielectric layer (IDL) 30 formed thereon, ashing removable dielectric (ARD) layer 40 formed thereon, and top dielectric anti-reflective coating (DARC) layer 50 formed thereon. Prior to placing semiconductor 10 in a first etching chamber, a photoresist layer 90 is again deposited on top of dielectric anti-reflective coating layer 50 similarly to that shown in FIG. 1. However, the photoresist layer this time has been patterned by photolithography with a trench-shaped resist pattern in the form of first opening 94 having a trench-shaped profile.

Figure 13:
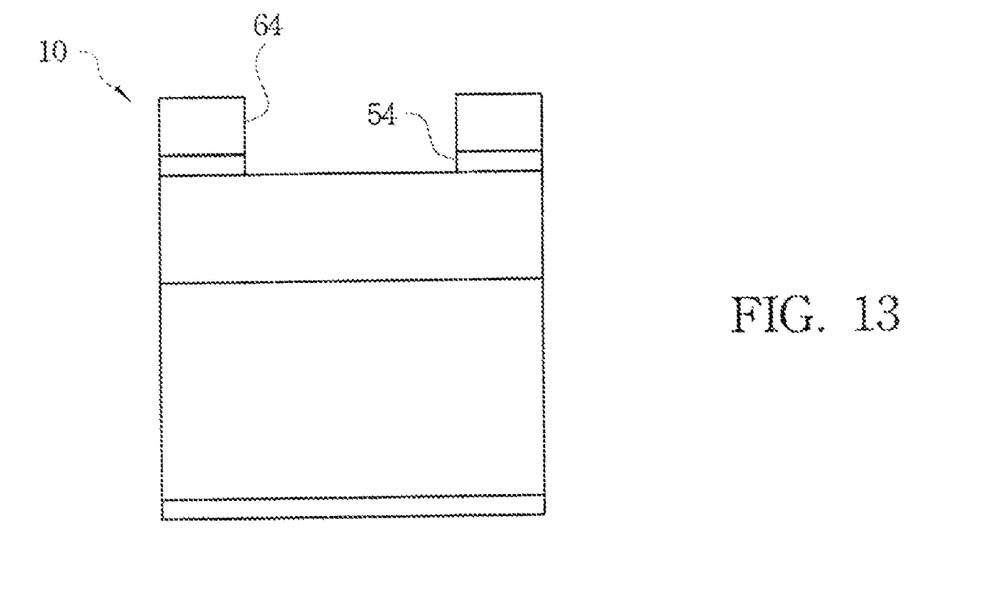

After patterning photoresist layer 90, semiconductor 10 is then placed in a first etching chamber in FIG. 12 to begin the etching processes. Referring to FIG. 13, an opening 54 is first formed in dielectric anti-reflective coating 50 by a first dry etching using etching gas EG described herein or another suitable gas plasma depending on the material selected for dielectric anti-reflective coating 50.

Figure 14:
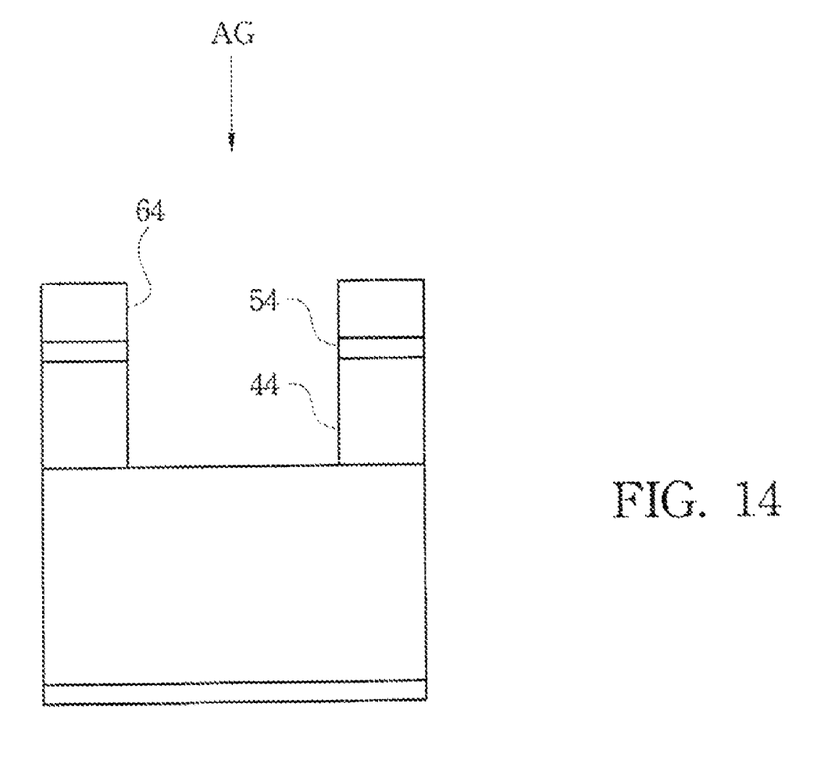
Figure 18:
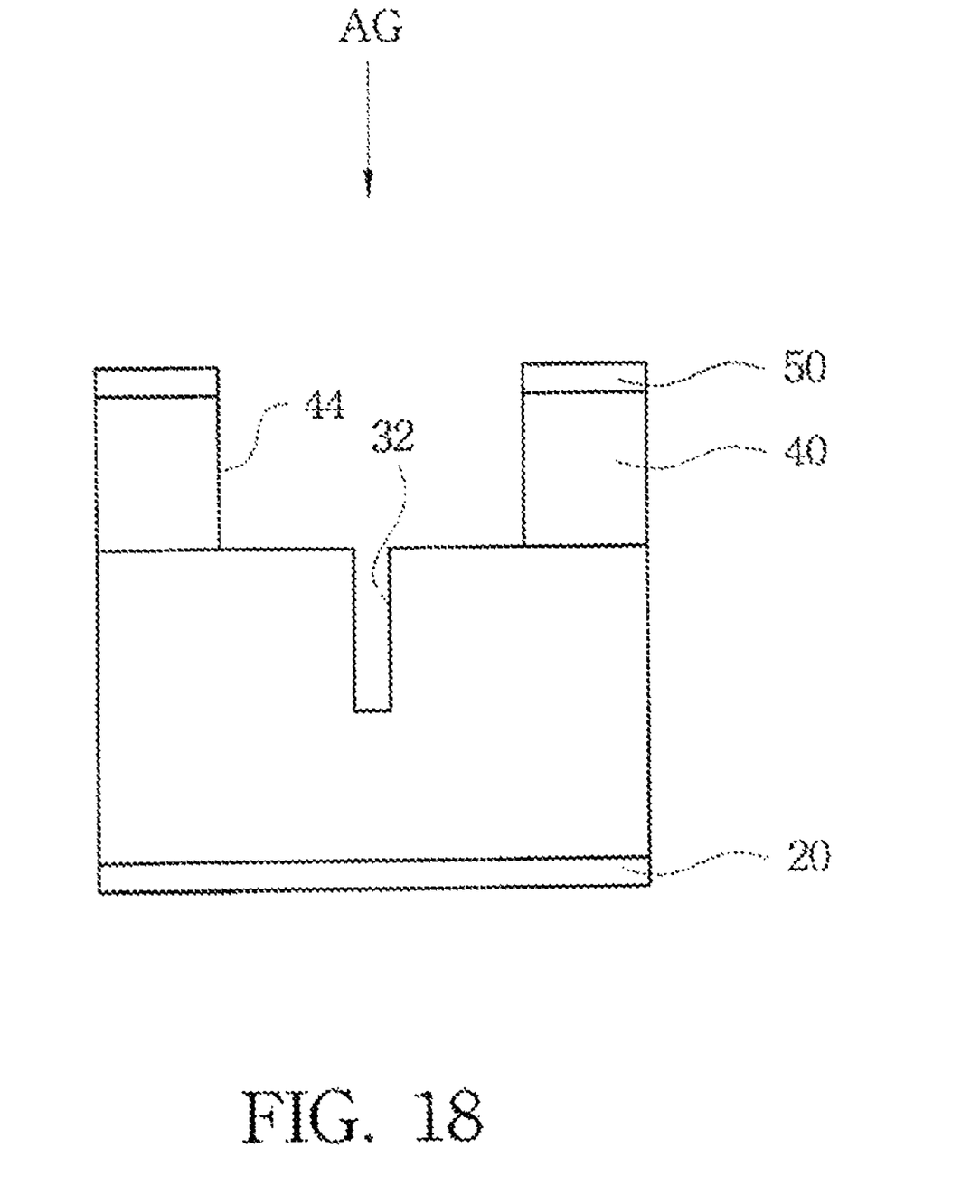

In the etching step shown in FIG. 14, a trench-shaped opening 44 is formed in ashing removable dielectric 40 by dry ashing using ashing gas AG to define a predetermined trench profile. Preferably, ashing removable dielectric 40 is made of a material which can be dry etched using the same ashing gas AG which can be used to etch photoresist layer 90. Ashing removable dielectric 40 with opening 44 defines a trench-shaped in-situ hard mask which can later be used in the main via-trench formation process to create trench 34 in intermediate dielectric layer 30, as shown in FIG. 18.

Figure 15:
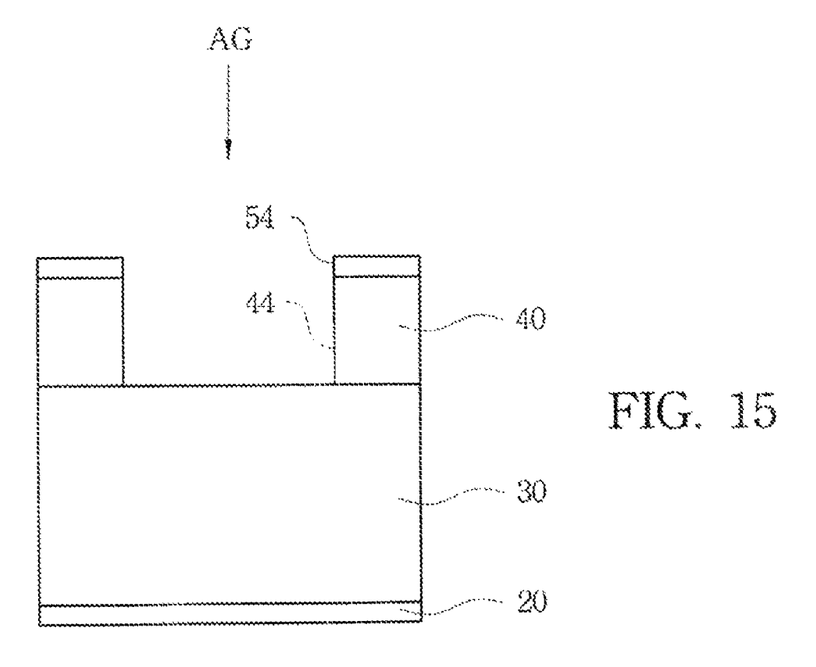
Figure 16:
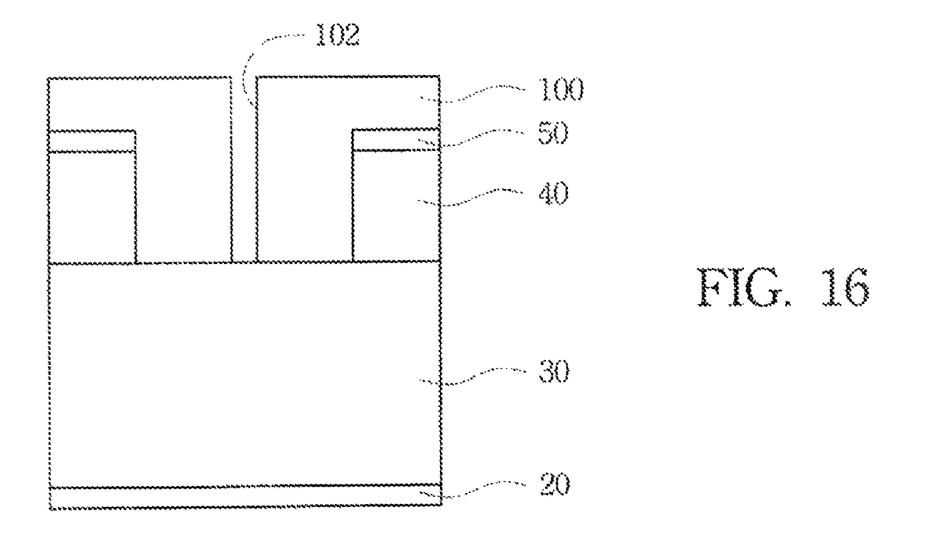

In the next step shown in FIG. 15, photoresist layer 90 is etched and completely removed from semiconductor 10 using ashing gas AG, leaving etched layers dielectric anti-reflective coating 50 and ashing removable dielectric 40 remaining above unetched intermediate dielectric layer 30. In a preferred embodiment, photoresist layer 90 is made of a material that is etchable and removable by the same ashing gas AG used to etch ashing removable dielectric 40. Preferably, therefore, the same ashing gas is used in this step to remove photoresist layer 90. It should be noted that dielectric anti-reflective coating 50, which preferably is made of a material that is unaffected by the ashing gas AG, functions to protect unexposed portions of ashing removable dielectric 40 when photoresist layer 90 is removed from semiconductor 10 as shown in FIG. 15.

It should be noted that in alternative embodiments, process steps shown in FIGS. 14 and 15 may be combined into a single step so that trench-shaped opening 44 may be formed and photoresist layer 90 may be removed at the same time. This is possible because both photoresist layer 90 and ashing removable dielectric 40 are susceptible to etching by the ashing gas AG in a preferred embodiment. In some embodiments, however, photoresist 90 thickness may be such that after trench-shaped opening 44 is formed in ashing removable dielectric 40 (see FIG. 14), some photoresist may remain (as also shown in FIG. 14) such that additional ashing shown in the step illustrated in FIG. 15 is required to completely remove the photoresist. In other embodiments, photoresist 90 thickness may be such that no photoresist remains after forming opening 44 in ashing removable dielectric 40 thereby requiring no further ashing.

After the trench-shaped in-situ hard mask has been formed in FIG. 15, semiconductor 10 is removed from the first etcher chamber. A new trench photoresist layer 100 is next deposited on semiconductor 10 on top of dielectric anti-reflective coating 50. Photoresist layer 100 is then patterned by photolithography to form a via-shaped opening 102 resulting in the semiconductor shown in FIG. 16. Via-shaped opening 102 is narrower than trench-shaped opening 94 in photoresist layer 90 (see, e.g., FIG. 14). It will be noted that trench-shaped opening 44 in ashing removable dielectric layer 40 is partially filled by a portion of photoresist layer 100 along the sidewalls of opening 44, which defines a via-shaped opening 102.

Figure 17:
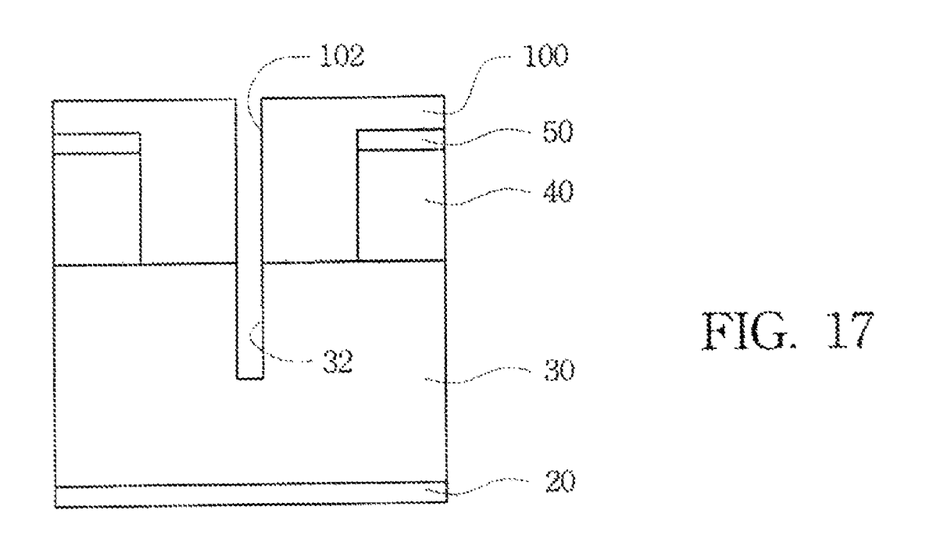

After photoresist layer 100 has been resist patterned, semiconductor 10 is then returned to the same etcher chamber or alternatively may be placed in a new etcher chamber to perform the remaining etching steps. Referring to FIG. 17, etching gas EG is used to dry etch and at least partially form via 32 in intermediate dielectric layer 30 by transferring via-shaped opening 102 in photoresist layer 100 downwards. Preferably, via 32 is etched to a depth that is less than the thickness of intermediate dielectric layer 30 so that via 32 does not contact bottom stop layer 20. In a preferred embodiment, both intermediate dielectric layer 30 and ashing removable dielectric 40 are susceptible to etching and material removal using the same etching gas EG. However, photoresist layer 100 preferably is not susceptible to etching using this etching gas EG so that layer 100 may be used to protect unexposed portions of dielectric anti-reflective coating 50 during this step, which in turn allows dielectric anti-reflective coating 50 to protect ashing removable dielectric 40 during subsequent removal of photoresist 100 as shown in FIG. 18.

In the next step shown in FIG. 18, photoresist 100 is dry etched using ashing gas AG and completely removed, thereby re-exposing trench-shaped opening 44 in ashing removable dielectric 40 which serves as an in-situ hard mask for etching intermediate dielectric layer 30. Since intermediate dielectric layer 30 is preferably not affected by the ashing gas AG, partially-formed via 32 is not deepened during this step.

Figure 19:
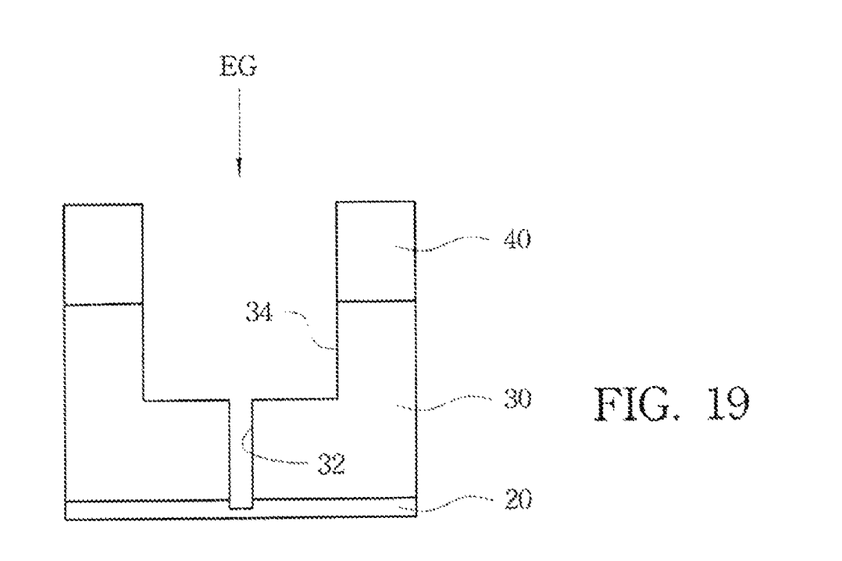

In the next step shown in FIG. 19, the full trench and via profiles are formed in intermediate dielectric layer 30 using the etching gas EG and the trench-shaped in-situ hard mask formed from ashing removable dielectric layer 40. This process step therefore fully extends partially-formed via 32 down to at least partially contact bottom stop layer 20, but preferably does not penetrate the bottom stop layer. Trench 34 is fully formed using trench-shaped opening 44 in ashing removable dielectric layer 40. Via 32 and trench 34 define an open dual damascene recess or structure that is sized and configured to receive a metallic interconnect conductor material, such as copper in one embodiment. Advantageously, trench 34 and via 32 may be formed during the same sequence of steps in a single dry etcher chamber using the in-situ hard mask in ashing removable dielectric layer 40. During this step, dielectric anti-reflective coating 50 is also completely removed by dry etching with etching gas EG to expose the top of ashing removable dielectric layer 40. It should be noted that dielectric anti-reflective coating 50 can now be removed in FIG. 19 since protective photoresist layer 100 had been previously removed in the step shown in FIG. 18. It will further be noted that in some embodiments, if trench 34 and via 32 are not fully formed when dielectric anti-reflective coating 50 has been completely removed by etching gas EG, the thickness of ashing removable dielectric layer 40 may be reduced as shown in FIG. 19 since the ashing removable dielectric is not completely resistant to etching gas EG due to the fluorine in the gas as noted above. Preferably, the thickness of the ashing removable dielectric layer 40 is sufficient so that it will not be completely removed at least until trench 34 and via 32 have been completely formed.

Figure 20:
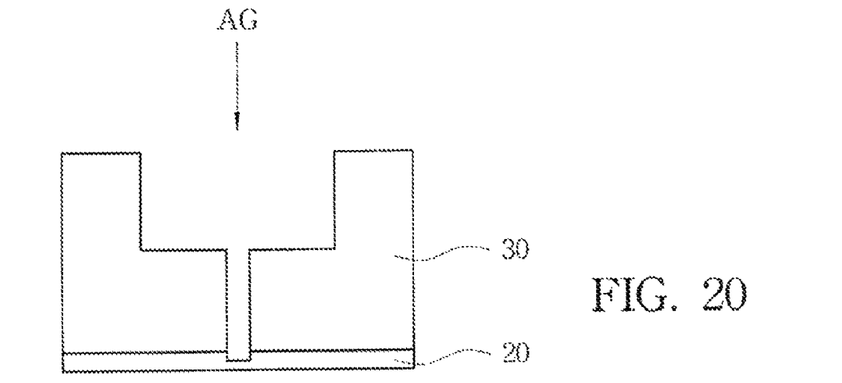

In the next step shown in FIG. 20, exposed ashing removable dielectric layer 40 is completely removed by dry ashing using ashing gas AG since dielectric anti-reflective coating layer 50 was removed in a prior step and is no longer available to protect the ashing removable dielectric layer from ashing.

Figure 21:
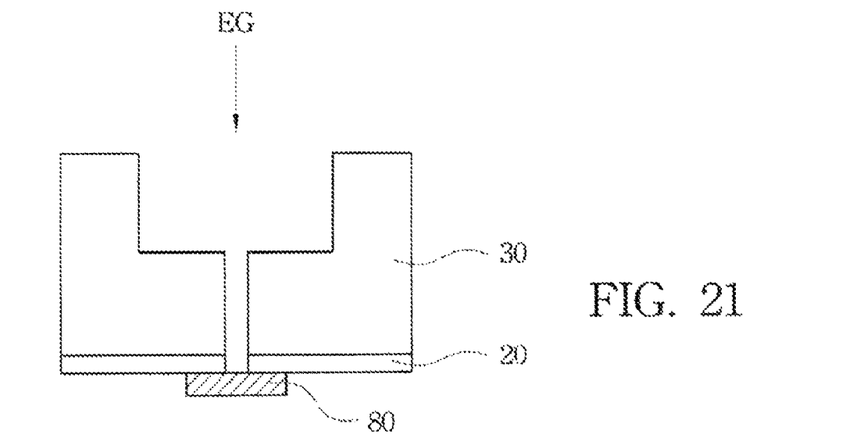

In the final step shown in FIG. 21, the portion of bottom stop layer 20 beneath via 32 is opened by dry etching using the etching gas EG to allow via 32 to communicate with copper conductor 80 which may be located in another semiconductor layer disposed beneath bottom stop layer 20.

In alternative embodiments, intermediate etch stop layers which in some embodiments may be similar in material and thickness to bottom stop layer 20 are contemplated.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the invention. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for forming a multi-layered semiconductor structure in an etcher chamber of an etching tool, comprising: providing an oxygen dry plasma ashing gas; providing a dry plasma etching gas having a different chemistry than the ashing gas; forming an intermediate dielectric layer directly on a bottom stop layer, the intermediate dielectric layer being formed of a low-k material that is selectively susceptible to etching by the etching gas but substantially resistant to etching by the ashing gas; forming an ashing removable dielectric layer directly on the intermediate dielectric layer, the ashing removable dielectric layer being formed of an amorphous carbon photoresist-like patterning film material that is selectively susceptible to etching by the ashing gas but substantially resistant to etching by the etching gas; forming a dielectric anti-reflective coating on the ashing removable dielectric layer, the dielectric anti-reflective coating being formed of a material that is selectively susceptible to etching by the etching gas but substantially resistant to etching by the ashing gas; forming a first patterned photoresist layer on the dielectric anti-reflective coating; introducing the etching gas into the etcher chamber to expose the semiconductor structure to the etching gas; etching the dielectric anti-reflective coating with the etching gas to form a first one of a via or trench using the patterned photoresist layer above, the etching process being terminated at an uppermost surface of the ashing removable dielectric which is resistant to etching by the etching gas chemistry, the patterned photoresist layer remaining intact after the etching being substantially unaffected by the etching gas; stopping the etching gas; introducing the ashing gas into the etcher chamber to expose the semiconductor structure to the ashing gas; etching the ashing removable dielectric with the ashing gas to form a via or trench corresponding to the trench or via formed in the dielectric anti-reflective coating above, the ashing process being terminated at an uppermost surface of the intermediate dielectric layer which is resistant to etching by the ashing gas chemistry, the intermediate dielectric layer remaining intact after the etching being substantially unaffected by the ashing gas, wherein an in-situ hard mask is defined in the ashing removable dielectric by the ashing gas; stopping the ashing gas; forming a second patterned photoresist layer on the dielectric anti-reflective coating after the step of etching the ashing removable dielectric with the ashing gas but before etching the intermediate dielectric layer with the etching gas, the second photoresist layer having a different pattern of a trench or via than the first photoresist layer; introducing the etching gas back into the etcher chamber to expose the semiconductor structure to the etching gas; etching the intermediate dielectric layer with the etching gas to form a via or trench using the patterned photoresist layer and trenches or vias formed in the dielectric anti-reflective coating and ashing removable dielectric layers above; and forming an in-situ mask in the ashing removable dielectric layer having the combined pattern of both a trench and a via.

2. A method for forming a multi-layered semiconductor structure in an etcher chamber of an etching tool, comprising: providing an oxygen dry plasma ashing gas; providing a dry plasma etching gas having a different chemistry than the ashing gas; forming an intermediate dielectric layer directly on a bottom stop layer, the intermediate dielectric layer being formed of a low-k material that is selectively susceptible to etching by the etching gas but substantially resistant to etching by the ashing gas; forming an ashing removable dielectric layer directly on the intermediate dielectric layer, the ashing removable dielectric layer being formed of an amorphous carbon photoresist-like patterning film material that is selectively susceptible to etching by the ashing gas but substantially resistant to etching by the etching gas; forming a dielectric anti-reflective coating on the ashing removable dielectric layer, the dielectric anti-reflective coating being formed of a material that is selectively susceptible to etching by the etching gas but substantially resistant to etching by the ashing gas; forming a first patterned photoresist layer on the dielectric anti-reflective coating; introducing the etching gas into the etcher chamber to expose the semiconductor structure to the etching gas; etching the dielectric anti-reflective coating with the etching gas to form a first one of a via or trench using the patterned photoresist layer above, the etching process being terminated at an uppermost surface of the ashing removable dielectric which is resistant to etching by the etching gas chemistry, the patterned photoresist layer remaining intact after the etching being substantially unaffected by the etching gas; stopping the etching gas; introducing the ashing gas into the etcher chamber to expose the semiconductor structure to the ashing gas; etching the ashing removable dielectric with the ashing gas to form a via or trench corresponding to the trench or via formed in the dielectric anti-reflective coating above, the ashing process being terminated at an uppermost surface of the intermediate dielectric layer which is resistant to etching by the ashing gas chemistry, the intermediate dielectric layer remaining intact after the etching being substantially unaffected by the ashing gas, wherein an in-situ hard mask is defined in the ashing removable dielectric by the ashing gas; stopping the ashing gas; forming a second patterned photoresist layer on the dielectric anti-reflective coating after the step of etching the ashing removable dielectric with the ashing gas but before etching the intermediate dielectric layer with the etching gas, the second photoresist layer having a different pattern of a trench or via than the first photoresist layer; introducing the etching gas back into the etcher chamber to expose the semiconductor structure to the etching gas; etching the intermediate dielectric layer with the etching gas to form a via or trench using the patterned photoresist layer and trenches or vias formed in the dielectric anti-reflective coating and ashing removable dielectric layers above; and forming an in-situ mask in the ashing removable dielectric layer having the combined pattern of both a trench and a via; wherein the combined pattern is simultaneously formed in the ashing removable dielectric layer in the step of etching the intermediate dielectric layer with the etching gas.

3. The method of claim 2, further comprising steps of introducing the ashing gas back into the etcher chamber and etching the ashing removable dielectric layer with the ashing gas to extend the trench completely down to the intermediate dielectric layer.

4. The method of claim 3, further comprising steps of introducing the etching gas back into the etcher chamber and etching the intermediate dielectric layer with the etching gas to transfer the trench from the ashing removable dielectric layer into the intermediate dielectric layer.

5. The method of claim 4, wherein the step of etching the intermediate dielectric layer with the etching gas to transfer the trench into the intermediate dielectric layer includes simultaneously extending the via completely down to the bottom stop layer.

6. The method of claim 5, further comprising steps of introducing the ashing gas back into the etcher chamber and etching the ashing removable dielectric layer with the ashing gas to completely remove the ashing removable dielectric layer.

7. The method of claim 2, wherein the ashing gas contains a reactive species selected from the group consisting of O2, N2, and H2.

8. The method of claim 7, wherein the reactive species in the ashing gas is O2.

9. The method of claim 1, further comprising steps of introducing the ashing gas back into the etcher chamber and etching the ashing removable dielectric layer with the ashing gas to extend the trench completely down to the intermediate dielectric layer.

10. The method of claim 9, further comprising steps of introducing the etching gas back into the etcher chamber and etching the intermediate dielectric layer with the etching gas to transfer the trench from the ashing removable dielectric layer into the intermediate dielectric layer.

11. The method of claim 10, wherein the step of etching the intermediate dielectric layer with the etching gas to transfer the trench into the intermediate dielectric layer includes simultaneously extending the via completely down to the bottom stop layer.

12. The method of claim 11, further comprising steps of introducing the ashing gas back into the etcher chamber and etching the ashing removable dielectric layer with the ashing gas to completely remove the ashing removable dielectric layer.

13. The method of claim 1, wherein the ashing gas contains a reactive species selected from the group consisting of O2, N2, and H2.

14. The method of claim 13, wherein the reactive species in the ashing gas is O2.

* * * * *